United States Patent [19]

Brevard et al.

[11] Patent Number: 4,958,126
[45] Date of Patent: Sep. 18, 1990

[54] PROBE FOR MAGNETIC RESONANCE SPECTROMETRIC MEASURES AT VERY HIGH TEMPERATURES

[75] Inventors: Christian Brevard, Wissembourg; Jean-Pierre Coutures, Orleans; Dominique Massiot, Orleans; Jean-Claude Rifflet, Orleans; Francis Taulelle, Bourg La Reine, all of France

[73] Assignee: Sadis Bruker Spectrospin, S.A., Wissembourg, France

[21] Appl. No.: 317,508

[22] Filed: Mar. 1, 1989

[30] Foreign Application Priority Data

Mar. 1, 1988 [FR] France ................................. 88-02740

[51] Int. Cl.$^5$ ............................................. G01R 33/20
[52] U.S. Cl. ..................................... 324/318; 324/307; 324/321
[58] Field of Search ............... 324/300, 307, 318, 321, 324/322

[56] References Cited

U.S. PATENT DOCUMENTS

| | | | |
|---|---|---|---|
| 4,088,944 | 5/1978 | Engler | 324/321 |
| 4,201,941 | 5/1980 | Fyfe et al. | 324/321 |
| 4,275,350 | 6/1981 | Hill et al. | 324/321 |
| 4,446,430 | 5/1984 | Stejskal | 324/321 |
| 4,456,882 | 6/1984 | Doty | 324/321 |
| 4,739,270 | 4/1988 | Daugaard | 324/321 |
| 4,806,868 | 2/1989 | Schulke | 324/321 |

Primary Examiner—Michael J. Tokar
Attorney, Agent, or Firm—Schwartz & Weinrieb

[57] ABSTRACT

A probe for spectrometric measurements of magnetic resonance at very high temperatures includes a resonator (3) within which is disposed a sample (9) to be analyzed. A laser beam from a laser (6) is conducted toward and focused upon the sample (9) for heating the same, and levitation of the sample (9) during measurement proceedings within the resonator (3), as a means of thermally isolating the sample (9) from its surroundings, is achieved by means of a levitation gas from a gas source (18) which is introduced into the resonator (3) by means of a constriction zone aperture (17) whereby the sample (9) is maintained within an upper cavity (16) of the resonator (3).

15 Claims, 2 Drawing Sheets

PROBE FOR MAGNETIC RESONANCE SPECTROMETRIC MEASURES AT VERY HIGH TEMPERATURES

FIELD OF THE INVENTION

This invention concerns an improved probe for spectrometric measurements of magnetic resonance at very high temperatures such as those made with the resonators used in nuclear magnetic resonance or electronic paramagnetic resonance.

BACKGROUND OF THE INVENTION

The transmission of energy to the system of nuclear spins that represents the sample of material during the period of excitation is accomplished by means of the probe that carries the aforesaid sample.

The recovery of energy emitted by the system of spins returning to equilibrium is also accomplished by the probe.

The probe constitutes the essential part of a resonator. The spectrometric measurement of resonance is accomplished by it.

The probe is composed of a mechanical sample carrier component and of the antenna network electronic circuit that forms the radio resonator, or properly speaking, the microwave resonator. This network creates an electromagnetic wave in the range of radio or microwave frequencies concentrated in the volume containing the sample.

To make a spectrometric resonance measurement at very high temperatures using a resonator used in magnetic resonance, two essential conditions must be satisfied simultaneously:

the sample must be contained in the volume of radio frequency or microwave frequency irradiation, the sample must be heated in the same irradiation volume to permit measurements at the desired temperatures.

At the present time, the sample is heated by a temperature-controlled stream of air passing through the chamber of the resonator enclosing the sample carrier.

The temperature is regulated at a set value, for example $+100°$ C., printed on the control panel, and maintained in the measurement chamber using a control loop, for example a thermocouple control loop.

For measurement temperatures between 200 and 600° C., a special shielded probe is presently used in magnetic resonance measurements which is cooled by a pump and heat-removing fluid (usually oil).

This type of cooling necessary to protect the resonator adds greatly to the total cost of the measurement probe.

The radio frequency or microwave frequency emission by the sample is detected by a sensor sensitive in the radio frequency or microwave frequency band being studied.

Traditionally, this sensor is in direct contact with the sample.

Since the sample and sensor are necessarily joined, the temperature increase of the sample results in a corresponding increase of the thermal noise of the sensor, which masks the signal to be measured.

Furthermore, any thermal insulation by wrapping or otherwise is unsuitable because of the difficulties of the wrapper in maintaining the temperature, and for various other types of thermal insulation, because of their screening characteristics for radio frequency or microwave frequency waves and because of the noise signals that they may generate.

The second important condition for the measurement to have meaning is not to change the sample and to avoid any chemical reaction with the container that holds it.

Actually, the heated samples show physical and chemical characteristics themselves that may modify the characteristics of the sensor by reaction with the sample carrier.

Because of this, these temperature increases may induce chemical reactions by interaction with the support in the midst of the sample, whose nature is variable and thus significantly falsifies the measurements.

Finally, a significant elevation of the measurement temperatures is propagated to the resonator by thermal dissipation and thus modifies greatly its operating characteristics.

OBJECT OF THE INVENTION

The purpose of the invention is to accomplish complete independence between the sample and the sensor while maintaining the sample in the irradiation volume during the heating under conditions that permit reaching very high temperatures for the intended measurements, between 800 and 2500° C.

SUMMARY OF THE INVENTION

This invention eliminates multiple technological constraints associated with the significant temperature increase desirable for observation of the behavior of certain material at high temperature such as refractory or ceramic materials and others, either in the solid state or in the liquid state.

To this end, it concerns a probe for a spectrometer resonator for very high temperatures, characterized by the fact that a laser beam focused on the sample is used as the means of heating, together with levitation of the sample in the interior volume of the resonator as the means of decoupling.

Numerous benefits are obtained with the present invention, such as:

the complete independence between the resonator and the sample that permits measurements at very high temperature in the range of 800–2500° C.;

the possibility of substituting this type of probe for that presently existing by simple modifications limited to minor adaptations;

the guarantee that the characteristics of the probe and those of the operation of the assembly remain essentially identical regardless of the temperature;

simplicity of implementation;

high temperatures are achieved readily without loss of sensitivity;

strong decoupling obtained by levitation of the sample;

thermal dissipation channeled through the flow of levitation gas and coil kept under evaporated nitrogen flow.

BRIEF DESCRIPTION OF THE DRAWINGS

This invention will be clear to the reader from the following description, given by way of nonlimiting example of an embodiment in nuclear magnetic resonance spectrometry with reference to the accompanying drawings, in which.

DETAILED DESCRIPTION OF THE PREFERRED EMBODIMENT

Figure 1:
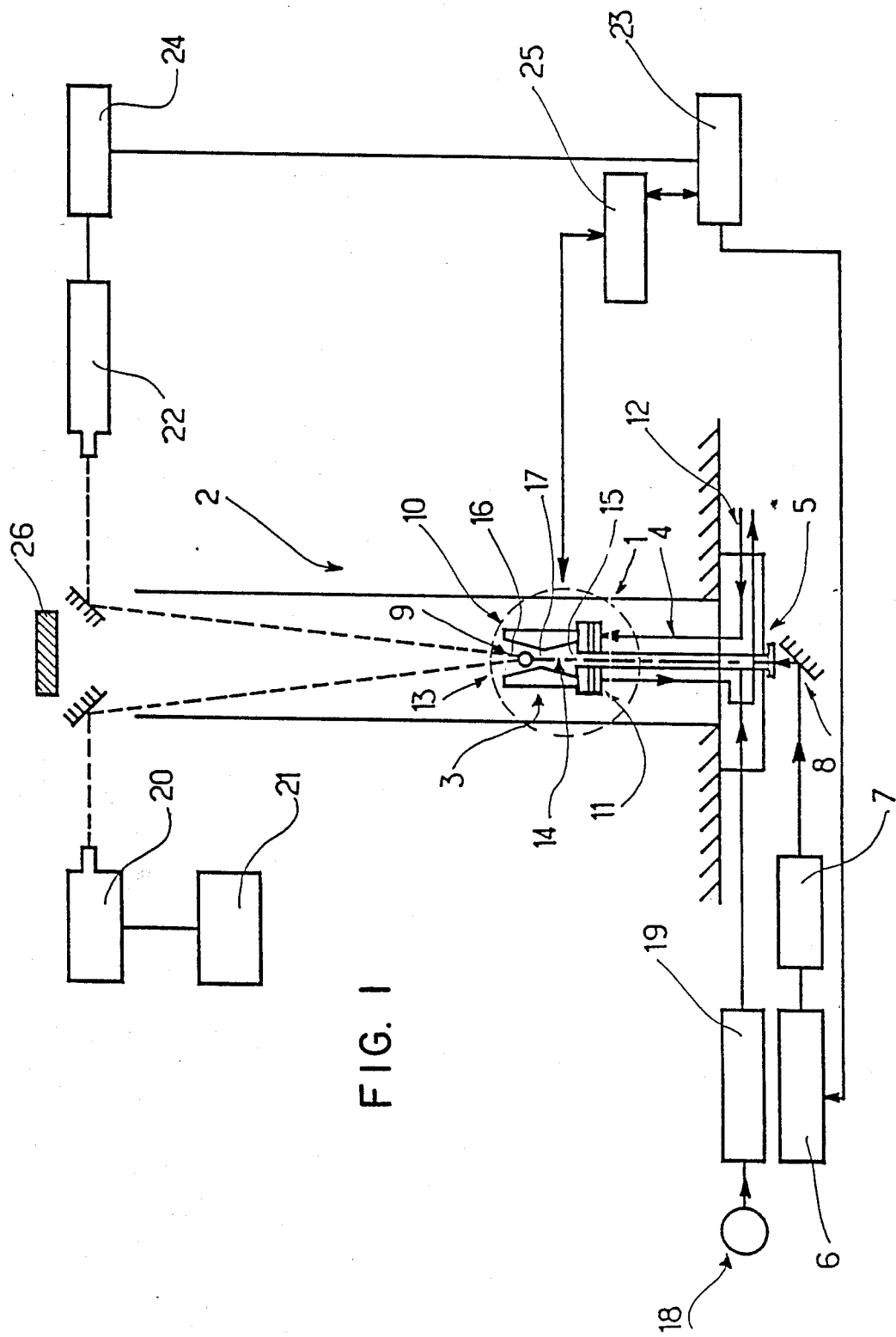
FIG. 1 is the general diagram of the probe and its assembly for measurement and analysis.
Figure 2:
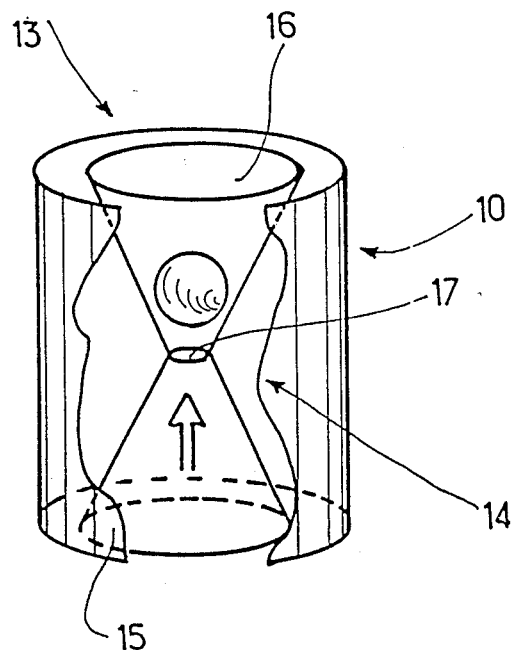
FIG. 2 is a schematic perspective view of the body of the levitation resonator, with sample in place.

The invention in general and some specific examples will be described below.

It should be understood that all of the equivalent means, i.e., those that perform the same function for the purpose of obtaining the same results, are suitable and are part of the invention.

The general inventive concept consists of using two principal means combined to provide for total independence of the sample relative to its surroundings and its heating.

It is a question on the one hand of maintaining the sample in constant levitation inside the resonator, using a controlled flow of a levitation gas.

On the other hand, it is a question of heating the sample using a coherent light beam focused on the sample.

The electronic system of the resonator is kept under a flow of evaporated nitrogen.

The general operation of the systems indicated above will now be described in more detail.

The probe pursuant to the invention has a probe body 1 to be inserted instead of a conventional probe in a superconducting magnetic coil 2. The probe body encloses a resonator-levitator 3.

In accordance with the invention, the resonator is optically linked to the exterior by a tube serving as an optical guide 4, that receives a coherent light beam emitted by a laser 6 of appropriate wavelength, through a terminal port 5, with the beam, after possible focusing by an optical element 7, being directed toward the aforesaid port by a reflecting mirror 8.

The laser beam passes through the resonator-levitator 3, in which there is a sample 9, and because of focusing, it is able to heat locally the central section of the resonator occupied by the aforesaid sample.

By way of example, a laser with wavelength of 1.06 $\mu$m may be used for metals, and a carbon dioxide 10.6 $\mu$m laser for insulators such as oxides, halogens, and others.

This original use of a laser as a means of heating the sample provides for a high concentration of energy in the volume occupied by the sample and permits a large increase of temperature.

Another original characteristic concerns the means of decoupling the sample to be analyzed, in which the resonator-levitator 3 of the probe pursuant to the invention has a hollow body 10 with its side closed face made of copper or any other suitable nonmagnetic metal or substance, with a generally cylindrical external shape, mounted on a metallic flange 11 cooled by a circuit 12 of evaporated nitrogen.

The parts of the resonator-levitator 3 compose the radio frequency antenna 13. In the preferred embodiment, they have an internal double-conical shape 14 that forms a double nozzle that converges and then diverges. This nozzle defines a free interior volume with a convergent conical lower cavity 15 and then a divergent conical upper cavity 16, with the cavities separated by a zone of constriction constituting a circular passage 17.

The sample 9 whose behavior is to be measured is located in the upper cavity 16.

The size of the sample should be chosen so that it cannot pass through the passage 17 of the constriction zone between the two cavities 15 and 16. Actually, in the absence of levitation force the sample is located at a low point and it is important for it to remain in the upper cavity.

In accordance with the invention, the sample 9 located in the upper cavity 16 is kept in levitation by the controlled flow of a levitation gas 18 introduced through the optical tube 14 in which the heating laser beam is propagated.

The flow of this gas is monitored by a flow meter 19 and regulated by an appropriate device.

The Venturi effect caused by the double-nozzle shape that converges and then diverges significantly improves the levitation power of the flow of gas as well as the thermal dissipation.

By way of example, the interior volume of the double cone has a total height of 20 mm, with a semi-angle of 60° and with the passage having a diameter between 2 and 3.5 mm.

It should be stated here that the body of the levitator, for example, is made of copper for the laser beam with a wavelength of 10.6 $\mu$m (carbon dioxide gas laser), and of ceramic when it is to be combined with a laser with wavelength of 1.06 $\mu$m.

The volume flow rate of the levitation gas is between 1 and 1.5 liters per minute.

By these means, a stable state of levitation for a sample weighing between 20 and 120 mg can be maintained for approximately 1 hour.

The radio frequency antenna, or more properly the resonator, should be formed by a current loop with inductive behavior.

To accomplish this, the body of the resonator-levitator 3 is made by stacking a succession of segments that are alternately conductive and then insulating, for example metallic and then ceramic, and preferably copper and then ceramic.

The resonant circuit thus constituted is matched and adapted to the working frequency or frequencies in question by attaching the necessary capacitors and inductances.

Various measuring and observation equipment and apparatus surround the probe, such as a camera 20 and monitor 21 for observing the sample in levitation, and a pyrometer 22 connected to a computer 23 by synchronous detection 24. The computer is connected to a spectrometer 25 and is also used to control the laser power.

Traditionally, the spectrometer is also connected to the radio frequency antenna composing the body of the resonator-levitator since according to the general principle of measurement, the antenna also serves as sensor.

For reasons of protection, a seal 26 made of material that absorbs the laser radiation used, for example made of ceramic, is provided at the output of the probe.

The sample temperature is measured by optical pyrometry in the range of 2 to 10 $\mu$m, and in the sector in which the material used does not transmit and has an emission factor close to unity.

Figure 3:
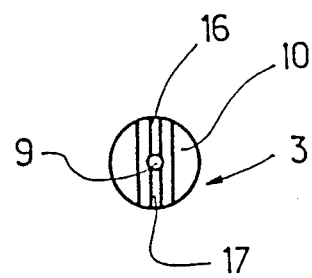
FIG. 3 is a detailed plan view of the body of the levitation resonator pursuant to a derived form.

A derived form of embodiment of the body of the resonator is shown in FIG. 3. In the variant, the lower and upper cavities 15 and 16 have a general prismatic shape and the passage 17 is a simple rectangular window.

Of course, the cavities are closed on the side to permit the gas flow to exert its levitation effect.

The invention has been described in detail above. However, it should be understood that various simple modifications, additions, direct variations, or substitutions by equivalent systems are within the scope of the present protection.

We claim:

1. Improved probe for spectrometric measurements of magnetic resonance at very high temperatures comprising a resonator (3) with hollow body containing a sample (9) to be analyzed, characterized by the fact that a coherent light beam is used as the means of heating the sample (9) together with levitation within the interior volume of the resonator as the means of decoupling the aforesaid sample (9) from its surroundings.

2. Probe pursuant to claim 1, characterized by the fact that the resonator at the same time is the levitator.

3. Probe pursuant to claims 2, characterized by the fact that the levitation is accomplished by means of a gas flow of monitored and regulated flow rate passing longitudinally through the body of the resonator-levitator (3).

4. Probe pursuant to claim 2, characterized by the fact that the body of the resonator-levitator (3) is hollow, that it has a closed lateral surface, and comprises a lower (15) and an upper (16) cavity separated by a zone of constriction forming a passage (17).

5. Probe pursuant to claim 4, characterized by the fact that the sample is of smaller size than the area of the passage (17).

6. Probe pursuant to claim 2, characterized by the fact that the body of the resonator-levitator (3) is formed by a stack of a succession of segments that are alternately conductive and then insulating.

7. Probe pursuant to claim 6, characterized by the fact that the succession of segments is an alternating succession of segments made of copper and then of ceramic.

8. Probe pursuant to claim 2, characterized by the fact that the body of the resonator-levitator (3) rests on a metallic flange (11) cooled by a refrigerating circuit containing a gas.

9. Probe pursuant to claim 2, characterized by the fact that the laser beam is introduced into the probe and the body of the resonator-levitator (3) by an optical guide (4).

10. Probe pursuant to claim 2, characterized by the fact that said probe is sealed by a shield that absorbs the laser radiation.

11. A probe as set forth in claim 3, wherein
the gas flow rate of said levitation gas is within the range of 1-1.5 liters/minute.

12. A proble as set fort in claim 1, further comprising:
computer means for controlling the power output of said coherent light beam.

13. A probe as set forth in claim 4, wherein
said upper and lower cavities have the configurations of truncated cones, and said zone of constriction passage comprises a circular aperture.

14. A probe as set forth in claim 4, wherein:
said upper and lower cavities have the configurations of prisms, and said zone of constriction passage comprises a substantially rectangular window.

15. A probe as set forth in claim 8, wherein:
said refrigeration gas is nitrogen.

* * * * *